United States Patent
Li et al.

(10) Patent No.: US 8,957,455 B1
(45) Date of Patent: Feb. 17, 2015

(54) MODULATION DOPED SUPER-LATTICE BASE FOR HETEROJUNCTION BIPOLAR TRANSISTORS

(75) Inventors: James Chingwei Li, Simi Valley, CA (US); Marko Sokolich, Los Angeles, CA (US); Tahir Hussain, Calabasas, CA (US); David H. Chow, Newbury Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 374 days.

(21) Appl. No.: 13/438,810

(22) Filed: Apr. 3, 2012

Related U.S. Application Data (62) Division of application No. 12/623,325, filed on Nov. 20, 2009, now Pat. No. 8,178,946.

(51) Int. Cl.
  *H01L 29/737* (2006.01)
(52) U.S. Cl.
  USPC .......................................... 257/197; 257/198
(58) Field of Classification Search
  USPC ...................................... 257/14–25, 197–201
  See application file for complete search history.

(56) References Cited

U.S. PATENT DOCUMENTS

| | | | |
|---|---|---|---|
| 5,329,145 A | 7/1994 | Nakagawa | 257/198 |
| 5,907,159 A | 5/1999 | Roh et al. | 257/26 |
| 7,115,466 B2 | 10/2006 | Welser et al. | 438/235 |
| 7,998,807 B2 * | 8/2011 | Feng et al. | 438/235 |
| 2003/0213973 A1 * | 11/2003 | Yoshioka et al. | 257/183 |
| 2004/0227155 A1 | 11/2004 | Hase | 257/197 |
| 2010/0140587 A1 * | 6/2010 | Carothers et al. | 257/14 |

OTHER PUBLICATIONS

U.S. Appl. No. 12/623,325, filed Nov. 2009, Li, et al.
Sze, S. M., "Physics of Semiconductor Devices" John Wiley and Sons (WIE), 2nd Edition, pp. 122-129 (1981).

* cited by examiner

*Primary Examiner* — Matthew W Such
*Assistant Examiner* — Ali Naraghi
(74) *Attorney, Agent, or Firm* — Ladas & Parry (57) ABSTRACT

A heterojunction bipolar transistor (HBT) having an emitter, a base, and a collector, the base including a first semiconductor layer coupled to the collector, the first semiconductor layer having a first bandgap between a first conduction band and a first valence band and a second semiconductor layer coupled to the first semiconductor layer and having a second bandgap between a second conduction band and a second valence band, wherein the second valence band is higher than the first valence band and wherein the second semiconductor layer comprises a two dimensional hole gas and a third semiconductor layer coupled to the second semiconductor layer and having a third bandgap between a third conduction band and a third valence band, wherein the third valence band is lower than the second valence band and wherein the third semiconductor layer is coupled to the emitter.

19 Claims, 7 Drawing Sheets

```
┌─────────────────────────────────────────────────────┐
│ FORMING A FIRST SEMICONDUCTOR LAYER COUPLED TO  100 │
│ THE COLLECTOR, THE FIRST SEMICONDUCTOR LAYER        │
│ HAVING A FIRST BANDGAP BETWEEN A FIRST              │
│ CONDUCTION BAND AND A FIRST VALENCE BAND            │
└─────────────────────────────────────────────────────┘
                           │
┌─────────────────────────────────────────────────────┐
│ FORMING ONE OR MORE LAYER GROUPS COUPLED       102  │
│ BETWEEN THE EMITTER AND THE FIRST LAYER, EACH       │
│ LAYER GROUP INCLUDING:                              │
│     A SECOND SEMICONDUCTOR LAYER HAVING A           │
│ SECOND BANDGAP BETWEEN A SECOND CONDUCTION          │
│ BAND AND A SECOND VALENCE BAND, WHEREIN THE         │
│ SECOND VALENCE BAND IS HIGHER THAN THE FIRST        │
│ VALENCE BAND; AND                                   │
│     A THIRD SEMICONDUCTOR LAYER HAVING A THIRD      │
│ BANDGAP BETWEEN A THIRD CONDUCTION BAND AND A       │
│ THIRD VALENCE BAND;                                 │
│     WHEREIN EACH OF THE THIRD VALENCE BANDS IS      │
│ LOWER THAN EACH OF THE SECOND VALENCE BANDS;        │
│ AND                                                 │
│     WHEREIN ONE OF THE THIRD SEMICONDUCTOR          │
│ LAYERS IS COUPLED TO THE EMITTER AND ONE OF THE     │
│ SECOND SEMICONDUCTOR LAYERS IS COUPLED TO THE       │
│ FIRST LAYER                                         │
└─────────────────────────────────────────────────────┘
                           │
┌─────────────────────────────────────────────────────┐
│ FORMING AN ADVANCING CONTACT COUPLED TO THE    104  │
│ FIRST SEMICONDUCTOR LAYER, AND EACH SECOND AND      │
│ THIRD SEMICONDUCTOR LAYER                           │
└─────────────────────────────────────────────────────┘
```

FIG. 6

| FORMING A CONDUCTION BAND GRADE IN THE BASE BETWEEN THE EMITTER AND THE COLLECTOR | 110 |

FIG. 7

| APPLYING A COMPRESSIVE STRAIN TO AT LEAST ONE SECOND SEMICONDUCTOR LAYER | 112 |

MODULATION DOPED SUPER-LATTICE BASE FOR HETEROJUNCTION BIPOLAR TRANSISTORS

CROSS REFERENCE TO RELATED APPLICATION

This is a divisional application of U.S. patent application Ser. No. 12/623,325, filed on Nov. 20, 2009, which is incorporated herein as though set forth in full.

FIELD

This disclosure relates to heterojunction bipolar transistors (HBTs), and in particular to bases for HBTs.

BACKGROUND

In order to improve the performance of HBT devices, it is desirable to lower the lateral sheet resistance of the HBT base. High performance InP DHBTs and other HBTs require the base transit time ($t_b$) to be scaled appropriately in order to improve the small-signal unity current gain frequency, ($f_T$) of the device. A smaller $t_b$ provides a higher $f_T$. At the same time, the lateral base resistance needs to be scaled appropriately to reduce the base resistance ($R_b$) and improve the small-signal unity power gain frequency ($f_{MAX}$), which indicates the maximum frequency at which useful power gain can be expected. The prior art approach is to make the base thinner to reduce $t_b$, but a thinner base negatively impacts $R_b$, because a thinner base increases the base resistance $R_b$.

Another approach in the prior art is to increase the doping concentration in the base to reduce $R_b$ while thinning the base as much as possible to reduce $t_b$. However, a high doping concentration leads to degraded hole mobility and decreased DC current gain, because of increased Auger recombination in which an electron and hole recombine. In developmental laboratories bases have been thinned to 20 nm and the base doping concentrations have been increased to $1*10^{20}$ cm$^{-3}$; however, these are extreme limits and are not considered realistic for a commercial InP DHBT process technology.

Another approach in the prior art has been to investigate DHBTs with GaAsSb bases due to the potentially high hole concentrations ($>1*10^{20}$ cm$^{-3}$) and the minimal conduction band offset to InP achievable with this material. However, the high hole concentration comes with reduced hole mobility relative to p-type InGaAs alloys. The electron mobility in p-type GaAsSb is also inferior to p-type InGaAs, which limits the $t_b$ and DC current gain for a GaAsSb base. The one true advantage of GaAsSb is the minimal conduction band offset of GaAsSb to InP.

Most of the industry has adopted DHBTs with an InGaAs alloy base. High doping concentrations ($8*10^{19}$ cm$^{-3}$) with carbon doping have been achieved without a severe penalty to the hole mobility and the electron transport in p-type InGaAs, especially when base layers with a field gradient are used. However, the 150-200 meV conduction band offset to InP requires that the base-collector junction be graded. The presence of this grade complicates the growth of the HBT material layers and can potentially limit the HBT performance. By optimizing the transition from the InGaAs alloy base into the InP wide bandgap collector, $f_T$ and $f_{MAX}$ values in excess of 400 GHz and 400 GHz, respectively, at low $V_{CB}$ can be achieved.

What is needed are HBTs and methods for fabricating HBTs with bases with reduced $R_b$ without increasing the base thickness. Also needed are HBTs and methods for fabricating HBTs with bases with reduced $t_b$ to provide high $f_T$ and $f_{MAX}$ devices. The embodiments of the present disclosure answer these and other needs.

SUMMARY

In a first embodiment disclosed herein, in a heterojunction bipolar transistor (HBT) having an emitter, a base, and a collector, the base comprises a first semiconductor layer coupled to the collector, the first semiconductor layer having a first bandgap between a first conduction band and a first valence band, and one or more layer groups coupled between the emitter and the first semiconductor layer, each semiconductor layer group comprising a second semiconductor layer having a second bandgap between a second conduction band and a second valence band, wherein the second valence band is higher than the first valence band and a third semiconductor layer coupled to the second semiconductor layer and having a third bandgap between a third conduction band and a third valence band, wherein each of the third valence bands is lower than each of the second valence bands, and wherein one of the third semiconductor layers is coupled to the emitter and one of the second semiconductor layers is coupled to the first semiconductor layer.

In another embodiment disclosed herein, a method for forming a heterojunction bipolar transistor (HBT) having an emitter and a collector comprises forming a first semiconductor layer coupled to the collector, the first semiconductor layer having a first bandgap between a first conduction band and a first valence band and forming one or more semiconductor layer groups coupled between the emitter and the first semiconductor layer, each semiconductor layer group comprising a second semiconductor layer having a second bandgap between a second conduction band and a second valence band, wherein the second valence band is higher than the first valence band, and a third semiconductor layer coupled to the second semiconductor layer and having a third bandgap between a third conduction band and a third valence band, wherein each of the third valence bands is lower than each of the second valence bands and wherein one of the third semiconductor layers is coupled to the emitter and one of the second semiconductor layers is coupled to the first semiconductor layer.

In yet another embodiment disclosed herein, a base for a heterojunction bipolar transistor (HBT) having an emitter and a collector comprises a first semiconductor layer coupled to the collector, the first semiconductor layer having a first bandgap between a first conduction band and a first valence band and a second semiconductor layer coupled to the first semiconductor layer and having a second bandgap between a second conduction band and a second valence band, wherein the second valence band is higher than the first valence band and wherein the second semiconductor layer comprises a two dimensional hole gas and a third semiconductor layer coupled to the second semiconductor layer and having a third bandgap between a third conduction band and a third valence band, wherein the third valence band is lower than the second valence band and wherein the third semiconductor layer is coupled to the emitter.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 1:
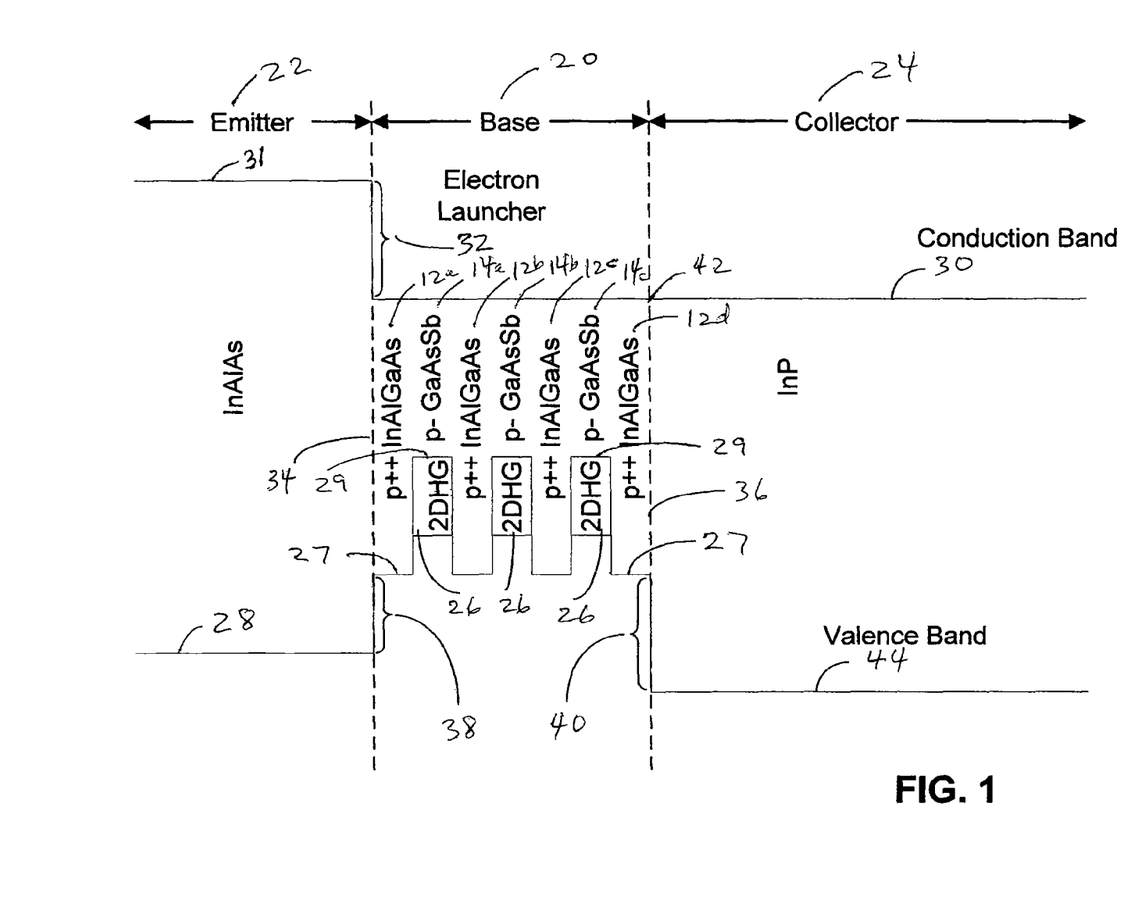
FIG. 1 is a band gap diagram under flat band conditions of an exemplary HBT in accordance with the present disclosure.

Referring to FIG. 1, a band diagram 10 for an exemplary HBT is shown. The HBT of FIG. 1 has alternating semiconductor material layers in the base 20 between the emitter 22 and the collector 24, namely first material layers 12 (12a, 12b, 12c, and 12d) made of InAlGaAs and second material layers 14 (14a, 14b, and 14c) made of GaAsSb. The first material layers 12 are between each second material layer 14 and also next to the emitter-base junction 34 and the base-collector junction 36. In another embodiment the base 20 may have only one second material layer 14 sandwiched between two first material layers 12 made of InAlGaAs, with one of the first material layers 12 adjacent the emitter 22 and one of the first material layers 12 adjacent the collector 24, which creates only one 2DHG 26 instead of the three 2DHG 26 shown in FIG. 3.

The InAlGaAs first material layers 12 are heavily doped p++ layers that serve as a source of holes for the 2DHG 26. The GaAsSb second material layers 14 are lightly doped p− layers; however, the GaAsSb second material layers 14 have a higher hole concentration than could be obtained with higher acceptor doping concentration alone.

The term bandgap refers to the energy difference between the top of the valence band and the bottom of the conduction band. The bandgap between the conduction band 30 and the valence band 27 for the InAlGaAs first material layers 12 is wider than the bandgap between the conduction band 30 and the valence band 29 for the GaAsSb second material layers 14. As explained below this difference in bandgaps causes a two dimensional hole gas (2DHG) 26 to form in each of the GaAsSb second material layers 14, which substantially increases the hole concentrations in the GaAsSb second material layers 14.

The relatively wide bandgap between the conduction band 30 and the valence band 27 for the InAlGaAs first material layers 12 and the relatively narrow bandgap between the conduction band 30 and the valence band 29 for the GaAsSb second material layers 14 causes the Fermi level to be deep in the base 20. Specifically, the Fermi level in the base 20 moves below the valence band 29 of the GaAsSb second material layers 14. Also because the valence band 29 in the GaAsSb second material layers 14 is higher than the valence band 27 in the InAlGaAs first material layers 12, which are donor layers, the holes from the InAlGaAs first material layers 12 move into the GaAsSb second material layers 14. The result is a 2DHG 26 in each of the GaAsSb second material layers 14, which substantially increases the hole density in each of the GaAsSb second material layers 14. The 2DHG 26 together with the low doping levels in the GaAsSb second material layers 14 provides high hole mobility for base 20.

In a particular embodiment, the p++ InAlGaAs first material layers 12 may have a doping concentration of about $3*10^{19}$ cm$^{-3}$ and the p− GaAsSb second material layers 14 may have a doping concentration of about $1*10^{17}$ cm$^{-3}$. In this embodiment the 2DHG 26 improves the hole mobility in the base 20 by about twice. The 2DHG 26 charge density in this embodiment is about $2*10^{12}$ cm$^{-2}$. The relative positions of the 2DHGs 26 in the base may be expected to change from that shown in FIG. 1 based on the material composition, variant selected, and other fabrication considerations.

As shown in FIG. 1 there is a large valence band offset 38 at the emitter-base junction 34 between the valence band 28 of the InAlAs emitter 22 and the valence band of the InAlGaAs first material layer 12. This valence band offset 38 suppresses any back injection of holes from the base 20 to the emitter 22. Similarly, the InP collector 24 shown in FIG. 1 has a valence band offset 40 at the base-collector junction 36 between the valence band 27 of the InAlGaAs first material layer 12 and the valence band 44 of the InP collector 24. This valence band offset 40 suppresses any injection of holes from the base 20 to the collector 22. Thus, the holes remain in base 20.

As shown in FIG. 1, the emitter 22 has a conduction band 31 and the base 20 and the collector 24 have a conduction band 30. There is a step 32 between the InAlAs emitter 22 conduction band 31 and the base 20 conduction band 30, which effectively creates an electron launcher, which drives electrons in the high-field transport regime for a portion of the distance into the base 20. In this embodiment, the zero conduction band offset 42 at the InAlGaAs to InP base-collector junction 36 eliminates the need for a graded layer at the base-collector junction 36.

Figure 2:
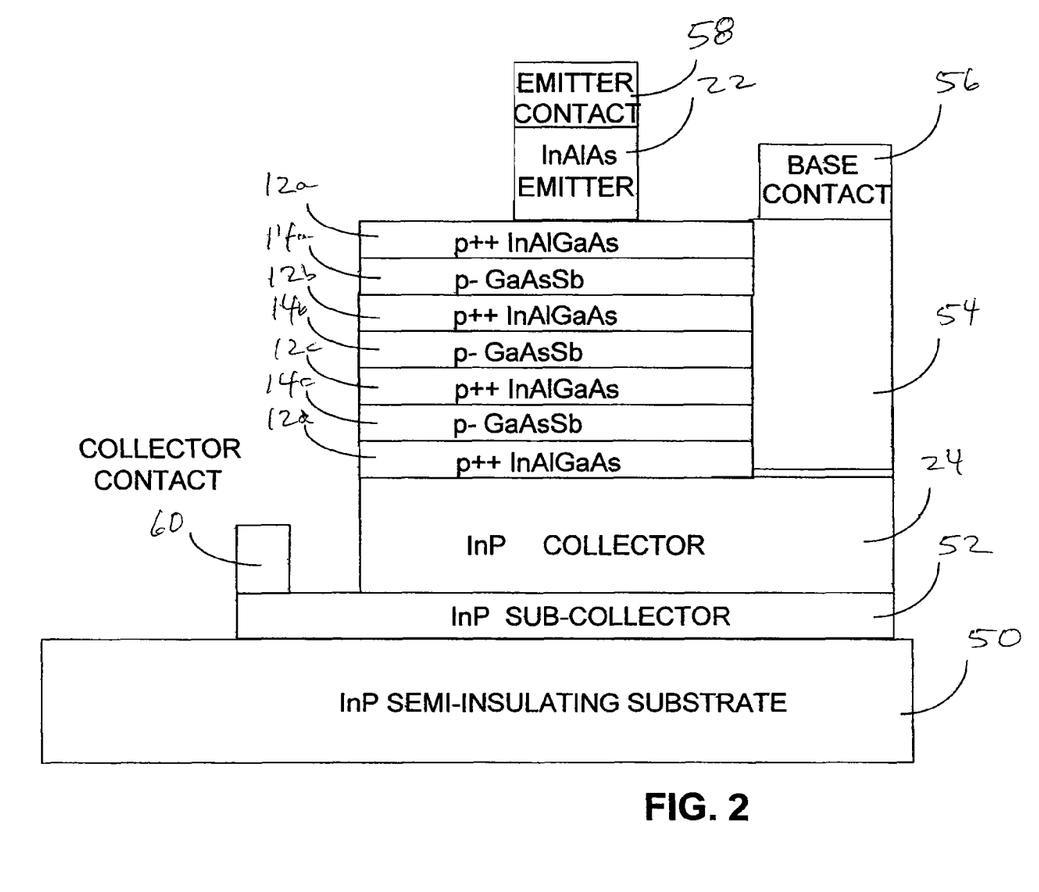
FIG. 2 is an elevation sectional view of an exemplary HBT with a modulation doped super-lattice base in accordance with the present disclosure.

FIG. 2 is an elevation sectional view of an exemplary HBT with a modulation doped super-lattice base in accordance with the present disclosure. An InP sub-collector 52 is formed on an InP semi-insulating substrate 50. In another embodiment, the sub-collector may be formed to include an InGaAs layer between the sub-collector 52 and the semi-insulating substrate 50, and/or an InGaAs layer between the sub-collector 52 and the collector 24.

On top of the InP sub-collector 52, the InP collector 24 is formed. The base is then formed with the alternating InAlGaAs first material layers 12 and GaAsSb second material layers 14, starting with an InAlGaAs first material layer 12 on top of collector 24, and ending with an InAlGaAs first material layer 12 below an InAlAs emitter 22. As discussed above, in another embodiment the base 20 may have only one second material layer 14 sandwiched between two first material layers 12 made of InAlGaAs, with one of the first material layers 12 adjacent the emitter 22 and one of the first material layers 12 adjacent the collector 24.

An advancing contact 54 is diffused to connect to all of the InAlGaAs first material layers 12 and GaAsSb second material layers 14. The advancing contact 54 allows holes to pass from the advancing contact 54 to any one of the 2DHGs 26. Finally, to connect to other circuitry, base contact 56, emitter contact 58 and collector contact 60 are formed.

Figure 3:
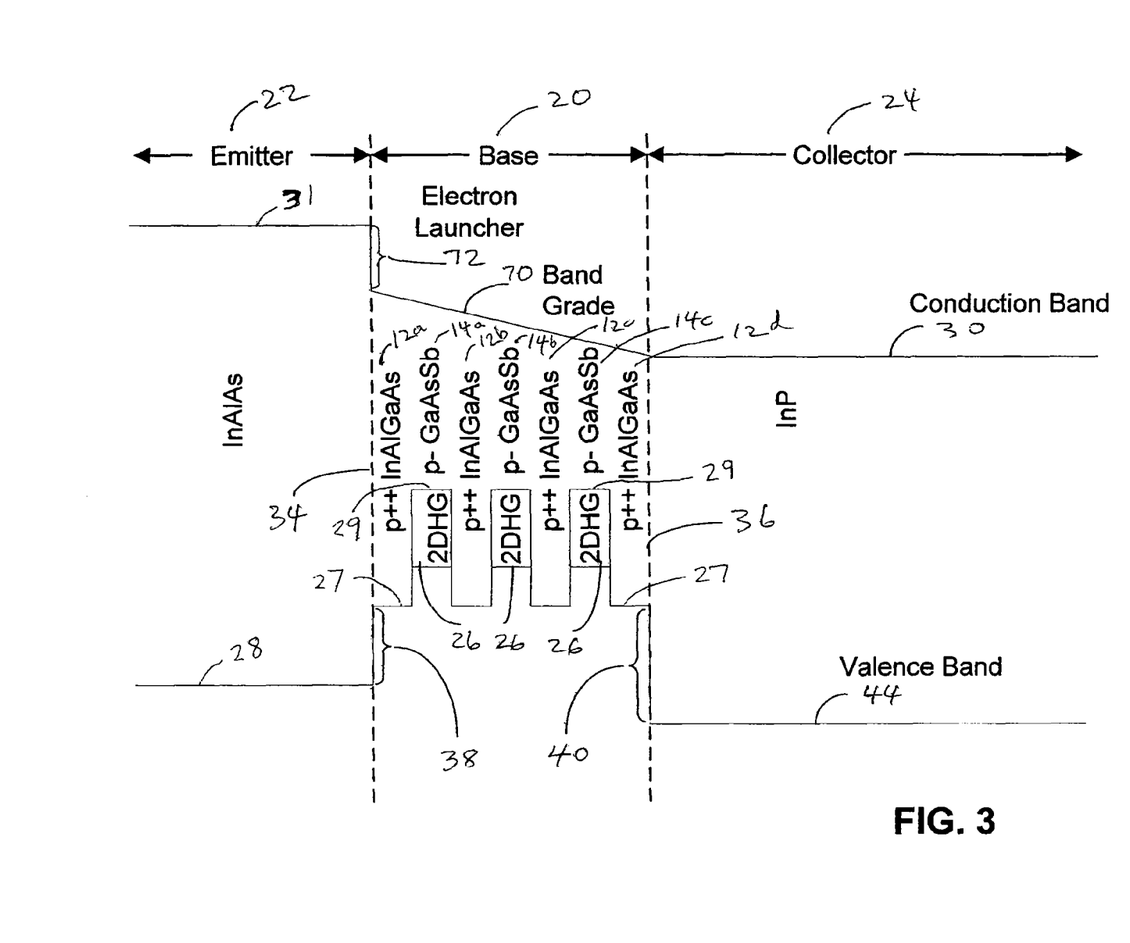
FIG. 3 is another band gap diagram under flat band conditions of an exemplary HBT in accordance with the present disclosure.

The composition of the InAlGaAs layers 12 and GaAsSb layers 14 may be altered to provide a conduction band grade 70 in the base 20, as shown in FIG. 3, while maintaining a 2DHG 26 in the GaAsSb second material layers 14 in the base 20. The conduction band grade 70 helps to overcome the poor low-field transport properties of GaAsSb. The conduction band grade 70 may be continuous, as shown in FIG. 3, or may be stepped with a series of steps across the base from the emitter to the collector. Also, as shown in FIG. 3, an electron launcher is created by the large conduction band offset 72 at the emitter-base junction 34, between the conduction band 31 of the emitter 22 and the conduction band grade 70 at the emitter-base junction 34.

Another approach to increasing hole mobility in the base, is to apply compressive strain to the GaAsSb second material layers 14, which forces the light hole band maxima higher than the heavy hole band maxima. Compressive strain can be applied through the proper selection of the first material layers 12 and second material layers 14, subsequent thin film deposition onto the HBT or any portion of the HBT, or any other fabrication method that produces compressive strain.

Figure 4:
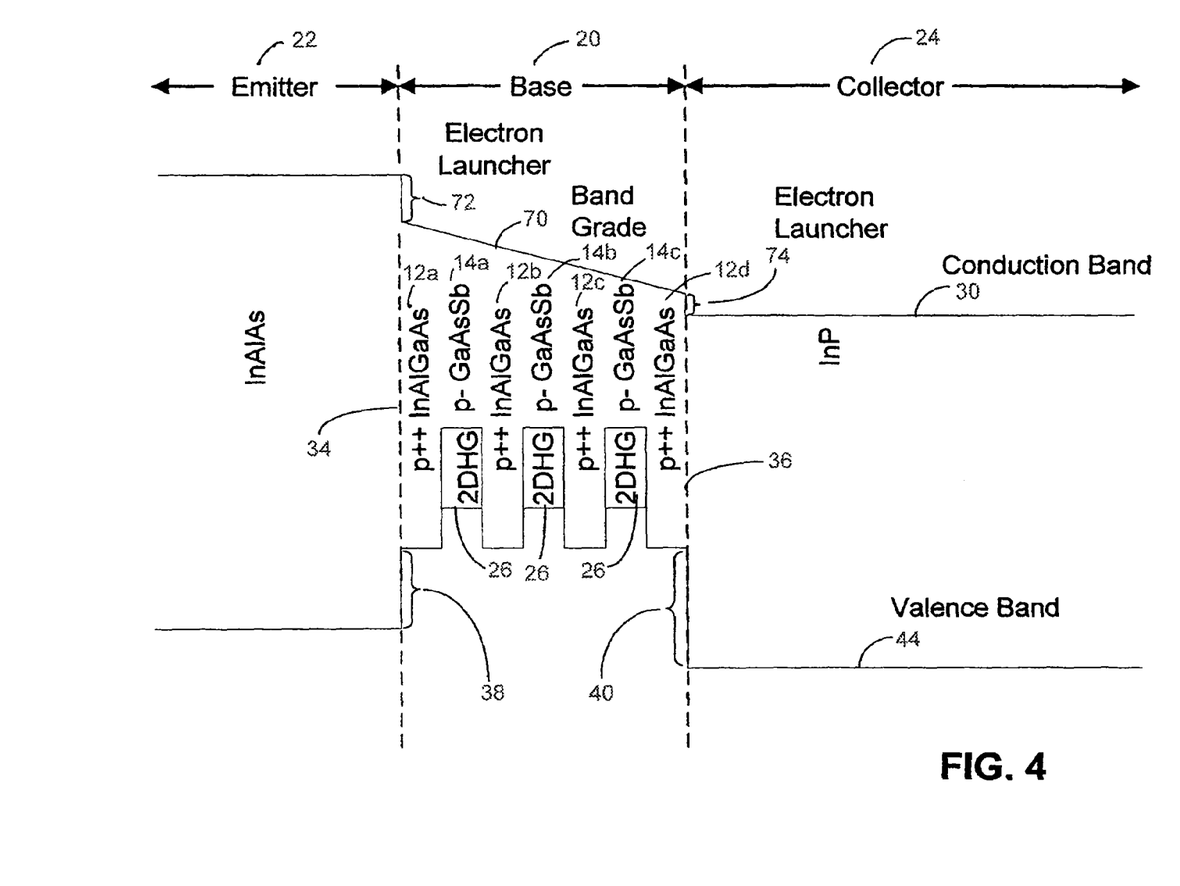
FIG. 4 is yet another band gap diagram under flat band conditions of an exemplary HBT in accordance with the present disclosure.

The composition of the InAlGaAs layers 12 and GaAsSb layers 14 may be further altered to produce a second electron launcher at the base-collector junction 36 by providing a conduction band offset 74 at the base-collector junction 36, as shown in FIG. 4. The second electron launcher produced by conduction band offset 74 together with the electron launcher produced by conduction band offset 72 at the emitter-base junction 34 increases the velocity of electrons from the emitter, through the base, and into the collector.

Figure 5:
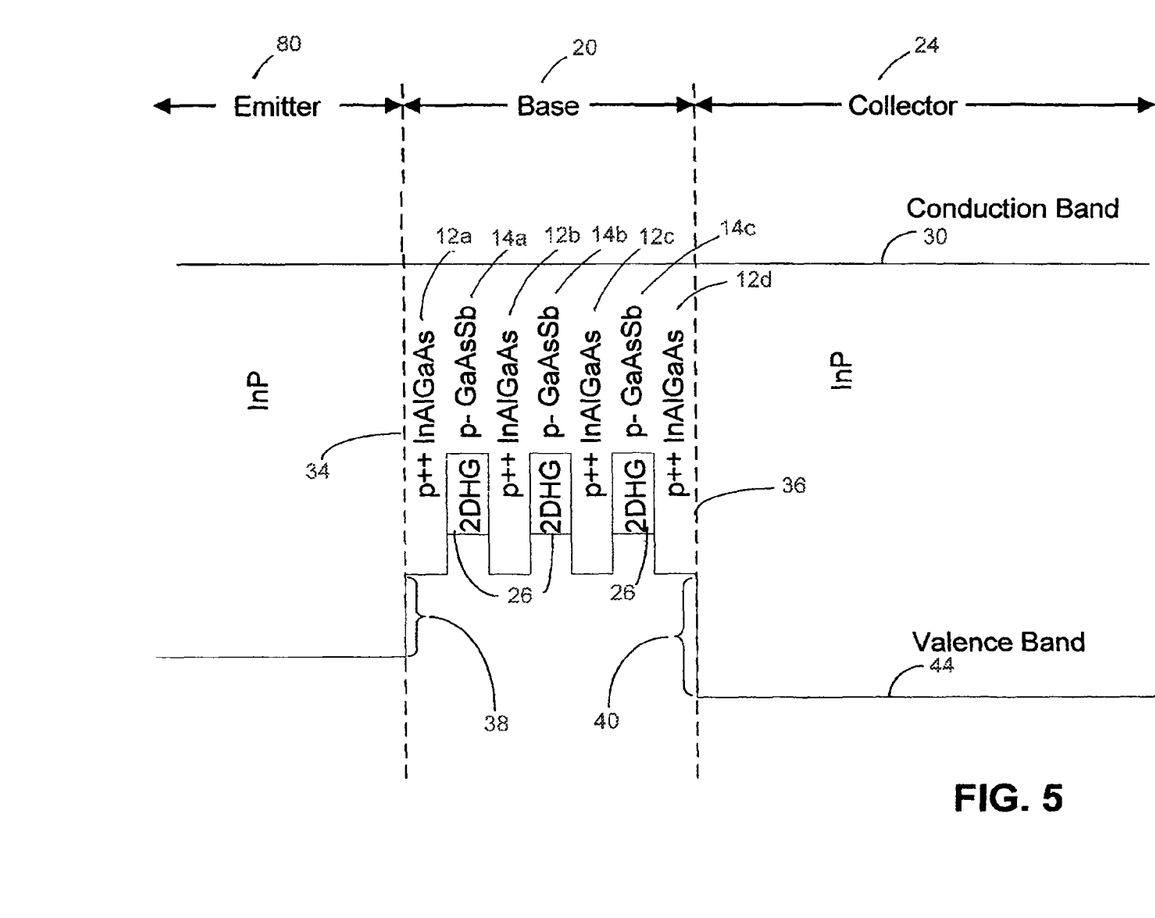
FIG. 5 is another band gap diagram under flat band conditions of an exemplary HBT in accordance with the present disclosure.

An InP emitter 80 may be used as shown in FIG. 5, instead of the InAlAs used in emitter 22 of FIGS. 1, 3 and 4. The InP emitter 80 provides better etch selectivity at the emitter-base junction 34. The 2DHGs 26 are still provided in the base 20 by the InAlGaAs first material layers 12 and GaAsSb second material layers 14. However, in this embodiment, the electron launcher at the emitter-base junction 34 is not provided, the conduction band grade is not present, and the electron launcher at the base-collector junction 36 is also not present. Thus the conduction band 30 is relatively flat across the emitter 80, base 20 and collector 24. This allows the forward ideality factor to be closer to unity, because the abrupt tunnel junction created by the conduction band offset 32, as shown in FIG. 1, is eliminated. The embodiment of FIG. 5 also provides a significant improvement in transconductance, gm.

In another embodiment the base in FIG. 5 may be graded; however, an additional InAlGaAs layer (not shown) needs to be inserted between the boundary of the base 20 in FIG. 5 and the InP collector 24. The additional InAlGaAs layer would have a different composition than the InAlGaAs layer 12d shown in FIG. 5.

Figure 6:
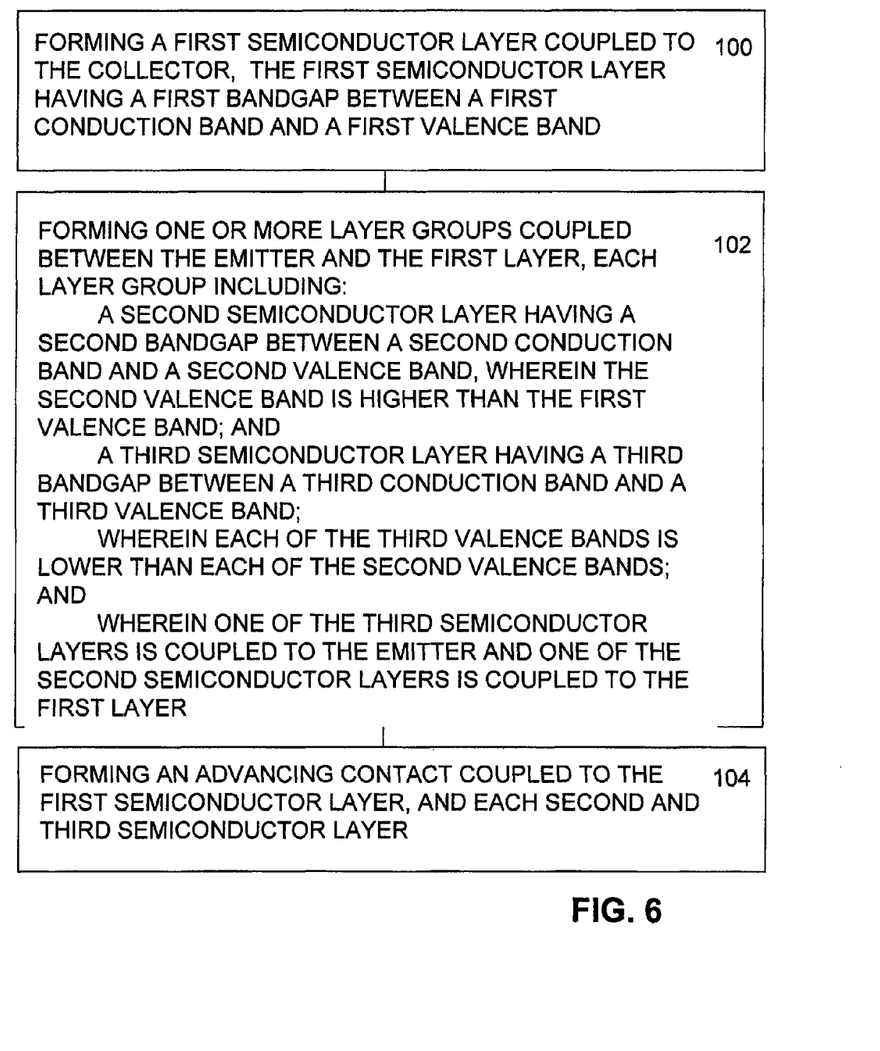
FIG. 6 is a flow chart of a method for forming a base of an HBT in accordance with the present disclosure.

FIG. 6 is a flow chart of a method for forming a base of an HBT in accordance with the present disclosure. In step 100 a first semiconductor layer, for example InAlGaAs first material layer 12 shown in FIG. 1, is formed coupled to the collector 24, the first semiconductor layer having a first bandgap between a first conduction band, for example conduction band 30 shown in FIG. 1, and a first valence band, for example valence band 27 shown in FIG. 1. Then in step 102 one or more layer groups is formed coupled between the emitter 22 and the first semiconductor layer. Each layer group includes a second semiconductor layer, for example GaAsSb second material layer 14 shown in FIG. 1, having a second bandgap between a second conduction band, which may be conduction band 30 shown in FIG. 1, and a second valence band, for example valence band 29 shown in FIG. 1, wherein the second valence band is higher than the first valence band. Each layer group also includes a third semiconductor layer having a third bandgap between a third conduction band, which may be conduction band 30 in FIG. 1, and a third valence band, which may be valence band 27 shown in FIG. 1. Each of the third valence bands is lower than each of the second valence bands. One of the third semiconductor layers is coupled to the emitter 22 and one of the second semiconductor layers is coupled to the first semiconductor layer.

Figure 7:
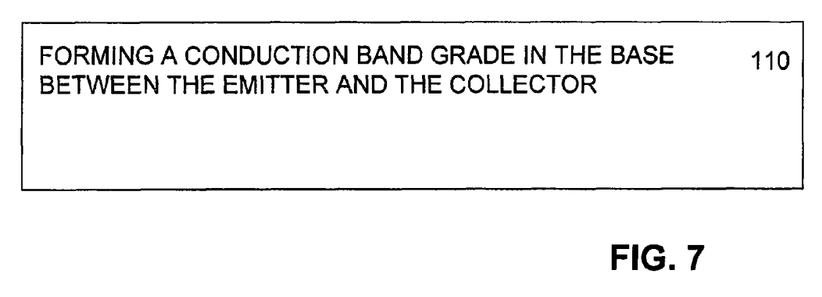
FIGS. 7 and 8 are flow charts for additional methods for forming a base of an HBT in accordance with the present disclosure.

FIG. 7 is a flow chart for an additional method for forming a base of an HBT in accordance with the present disclosure. Step 110 is an optional step that may be added to the method of FIG. 6. In Step 110 a conduction band grade 70, shown in FIGS. 3 and 4, is formed in the base 20 between the emitter 22 and the collector 24. The conduction band grade 70 may be formed by varying the composition of the first, second and third semiconductor layers formed by the method of FIG. 6.

Figure 8:
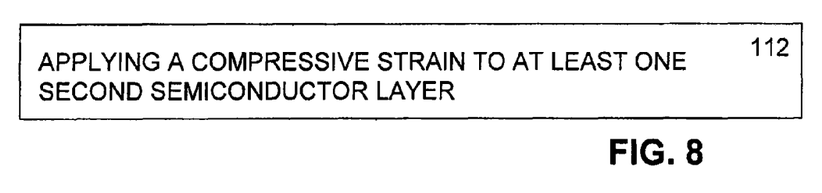

FIG. 8 is a flow chart for another additional method for forming a base of an HBT in accordance with the present disclosure. Step 112 is an optional step that may be added to the method of FIG. 6. In Step 112 a compressive strain is applied to at least one second semiconductor layer, which forces the light hole band maxima higher than the heavy hole band maxima, which improves hole mobility. Compressive strain can be applied through the proper selection of the first, second, and third material layers, subsequent thin film deposition onto the HBT or any portion of the HBT, or any other fabrication method that produces compressive strain.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . "

In broad overview, this description has disclosed a heterojunction bipolar transistor (HBT) having an emitter, a base, and a collector, the base including a first semiconductor layer coupled to the collector, the first semiconductor layer having a first bandgap between a first conduction band and a first valence band and a second semiconductor layer coupled to the first semiconductor layer and having a second bandgap between a second conduction band and a second valence band, wherein the second valence band is higher than the first valence band and wherein the second semiconductor layer comprises a two dimensional hole gas and a third semiconductor layer coupled to the second semiconductor layer and having a third bandgap between a third conduction band and a third valence band, wherein the third valence band is lower than the second valence band and wherein the third semiconductor layer is coupled to the emitter.

At least the following concepts have been presented by the present description.

Concept 1. A heterojunction bipolar transistor (HBT) having an emitter, a base, and a collector, the base comprising:
a first semiconductor layer coupled to the collector, the first semiconductor layer having a first bandgap between a first conduction band and a first valence band; and
one or more layer groups coupled between the emitter and the first semiconductor layer, each semiconductor layer group comprising:
a second semiconductor layer having a second bandgap between a second conduction band and a second valence band, wherein the second valence band is higher than the first valence band; and
a third semiconductor layer coupled to the second semiconductor layer and having a third bandgap between a third conduction band and a third valence band;
wherein each of the third valence bands is lower than each of the second valence bands; and
wherein one of the third semiconductor layers is coupled to the emitter and one of the second semiconductor layers is coupled to the first semiconductor layer.

Concept 2. The HBT of concept 1 wherein:
the first semiconductor layer and each third semiconductor layer comprise p++ InAlGaAs;
each second semiconductor layer comprises p− GaAsSb;
the emitter comprises InAlAs; and
the collector comprises InP.

Concept 3. The HBT of concept 1 wherein:
the first semiconductor layer and each third semiconductor layer comprise p++ InAlGaAs having a doping concentration of about $3*10^{19}$ cm$^{-3}$ or any other doping concentration such that the Fermi level of the second semiconductor layer is forced into the second valence band; and
each second semiconductor layer comprises p− GaAsSb having a doping concentration of about $1*10^{17}$ cm$^{-3}$ or any other doping concentration that minimizes impurity scattering.

Concept 4. The HBT of concept 1 wherein each second semiconductor layer comprises a two dimensional hole gas.

Concept 5. The HBT of concept 1 wherein:
the collector has a collector conduction band and a collector valence band; and
the collector valence band is lower than the first valence band of the first semiconductor layer.

Concept 6. The HBT of concept 5 wherein:
the emitter has an emitter conduction band and an emitter valence band;
the emitter conduction band is higher than the first conduction band of the first semiconductor layer, each second semiconductor layer and each third semiconductor layer; and
the emitter valence band is lower than the third valence band of the third semiconductor layer coupled to the emitter.

Concept 7. The HBT of concept 1 wherein the base comprises a conduction band grade between the emitter and the collector.

Concept 8. The HBT of concept 7 wherein the collector has a collector conduction band lower than a conduction band of the conduction band grade at a base-collector junction.

Concept 9. The HBT of concept 1 wherein each second semiconductor layer comprises a semiconductor having a compressive strain.

Concept 10. The HBT of concept 1 further comprising an advancing contact coupled to the first semiconductor layer, each second semiconductor layer and each third semiconductor layer.

Concept 11. The HBT of concept 1 wherein
the first semiconductor layer and each third semiconductor layer comprise p++ InAlGaAs;
each second semiconductor layer comprises p− GaAsSb;
the emitter comprises InP; and
the collector comprises InP.

Concept 12. The HBT of concept 11 wherein:
the collector has a collector conduction band and a collector valence band; and
the collector valence band is lower than the first valence band of the first semiconductor layer.

Concept 13. The HBT of concept 12 wherein:
the emitter has an emitter conduction band and an emitter valence band; and
the emitter valence band is lower than the third valence band of the third semiconductor layer coupled to the emitter.

Concept 14. The HBT of concept 11 wherein each second semiconductor layer comprises a two dimensional hole gas.

Concept 15. A method for forming a heterojunction bipolar transistor (HBT) having an emitter and a collector, the method comprising:
forming a first semiconductor layer coupled to the collector, the first semiconductor layer having a first bandgap between a first conduction band and a first valence band; and
forming one or more semiconductor layer groups coupled between the emitter and the first semiconductor layer, each semiconductor layer group comprising:
a second semiconductor layer having a second bandgap between a second conduction band and a second valence band, wherein the second valence band is higher than the first valence band; and
a third semiconductor layer coupled to the second semiconductor layer and having a third bandgap between a third conduction band and a third valence band;
wherein each of the third valence bands is lower than each of the second valence bands; and
wherein one of the third semiconductor layers is coupled to the emitter and one of the second semiconductor layers is coupled to the first semiconductor layer.

Concept 16. The method of concept 15 wherein:
the first semiconductor layer and each third semiconductor layer comprise p++ InAlGaAs;
each second semiconductor layer comprises p− GaAsSb;
the emitter comprises InAlAs; and
the collector comprises InP.

Concept 17. The method of concept 15 wherein:
the first semiconductor layer and each third semiconductor layer comprise p++ InAlGaAs having a doping concentration of about $3*10^{19}$ cm$^{-3}$ or any other doping concentration such that the Fermi level of the second semiconductor layer is forced into the second valence band; and each second semiconductor layer comprises p– GaAsSb having a doping concentration of about $1*10^{17}$ cm$^{-3}$ or any other doping concentration that minimizes impurity scattering.

Concept 18. The method of concept 15 wherein each second semiconductor layer comprises a two dimensional hole gas.

Concept 19. The method of concept 15 wherein:
the collector has a collector conduction band and a collector valence band; and
the collector valence band is lower than the first valence band of the first semiconductor layer.

Concept 20. The method of concept 19 wherein:
the emitter has an emitter conduction band and an emitter valence band;
the emitter conduction band is higher than the first conduction band of the first semiconductor layer, each second semiconductor layer and each third semiconductor layer; and
the emitter valence band is lower than the third valence band of the third semiconductor layer coupled to the emitter.

Concept 21. The method of concept 15 further comprising:
forming a conduction band grade between the emitter and the collector.

Concept 22. The method of concept 21 wherein the collector has a collector conduction band lower than a conduction band of the conduction band grade at a base-collector junction.

Concept 23. The method of concept 15 further comprising applying a compressive strain to at least one second semiconductor layer.

Concept 24. The method of concept 15 further comprising:
forming an advancing contact coupled to the first semiconductor layer, each second semiconductor layer and each third semiconductor layer.

Concept 25. The method of concept 15 wherein
the first semiconductor layer and each third semiconductor layer comprise p++ InAlGaAs;
each second semiconductor layer comprises p– GaAsSb;
the emitter comprises InP; and
the collector comprises InP.

Concept 26. The method of concept 25 wherein:
the collector has a collector conduction band and a collector valence band; and
the collector valence band is lower than the first valence band of the first semiconductor layer.

Concept 27. The method of concept 26 wherein:
the emitter has an emitter conduction band and an emitter valence band; and
the emitter valence band is lower than the third valence band of the third semiconductor layer coupled to the emitter.

Concept 28. The method of concept 25 wherein each second semiconductor layer comprises a two dimensional hole gas.

Concept 29. A base for a heterojunction bipolar transistor (HBT) having an emitter and a collector, the base comprising:
a first semiconductor layer coupled to the collector, the first semiconductor layer having a first bandgap between a first conduction band and a first valence band; and
a second semiconductor layer coupled to the first semiconductor layer and having a second bandgap between a second conduction band and a second valence band, wherein the second valence band is higher than the first valence band and wherein the second semiconductor layer comprises a two dimensional hole gas; and
a third semiconductor layer coupled to the second semiconductor layer and having a third bandgap between a third conduction band and a third valence band;
wherein the third valence band is lower than the second valence band; and
wherein the third semiconductor layer is coupled to the emitter.

What is claimed is:

1. A method for forming a heterojunction bipolar transistor (HBT) having an emitter and a collector, the method comprising:
forming a first semiconductor layer coupled to the collector, the first semiconductor layer having a first bandgap between a first conduction band and a first valence band; and
forming one or more semiconductor layer groups coupled between the emitter and the first semiconductor layer, each semiconductor layer group comprising:
a second semiconductor layer having a second bandgap between a second conduction band and a second valence band, wherein the second valence band is higher than the first valence band; and
a third semiconductor layer coupled to the second semiconductor layer and having a third bandgap between a third conduction band and a third valence band;
wherein each of the third valence bands is lower than each of the second valence bands;
wherein one of the third semiconductor layers is coupled to the emitter and one of the second semiconductor layers is coupled to the first semiconductor layer; and
wherein:
the first semiconductor layer and each third semiconductor layer comprise p++ InAlGaAs;
each second semiconductor layer comprises p– GaAsSb;
the emitter comprises InAlAs; and
the collector comprises InP.

2. The method of claim 1 wherein:
the first semiconductor layer and each third semiconductor layer comprise p++ InAlGaAs having a doping concentration of about $3*10^{19}$ cm$^{-3}$ or any other doping concentration such that the Fermi level of the second semiconductor layer is forced into the second valence band; and
each second semiconductor layer comprises p– GaAsSb having a doping concentration of about $1*10^{17}$ cm$^{-3}$ or any other doping concentration that minimizes impurity scattering.

3. The method of claim 1 wherein each second semiconductor layer comprises a two dimensional hole gas.

4. The method of claim 1 wherein:
the collector has a collector conduction band and a collector valence band; and
the collector valence band is lower than the first valence band of the first semiconductor layer.

5. The method of claim 4 wherein:
the emitter has an emitter conduction band and an emitter valence band;
the emitter conduction band is higher than the first conduction band of the first semiconductor layer, each second semiconductor layer and each third semiconductor layer; and
the emitter valence band is lower than the third valence band of the third semiconductor layer coupled to the emitter.

6. The method of claim 1 further comprising:
forming a conduction band grade between the emitter and the collector.

7. The method of claim 6 wherein the collector has a collector conduction band lower than a conduction band of the conduction band grade at a base-collector junction.

8. The method of claim 1 further comprising applying a compressive strain to at least one second semiconductor layer.

9. A method for forming a heterojunction bipolar transistor (HBT) having an emitter and a collector, the method comprising:

forming a first semiconductor layer coupled to the collector, the first semiconductor layer having a first bandgap between a first conduction band and a first valence band;

forming one or more semiconductor layer groups coupled between the emitter and the first semiconductor layer, each semiconductor layer group comprising:

a second semiconductor layer having a second bandgap between a second conduction band and a second valence band, wherein the second valence band is higher than the first valence band; and a third semiconductor layer coupled to the second semiconductor layer and having a third bandgap between a third conduction band and a third valence band; and forming an advancing contact coupled to the first semiconductor layer, each second semiconductor layer and each third semiconductor layer;

wherein each of the third valence bands is lower than each of the second valence bands; and wherein one of the third semiconductor layers is coupled to the emitter and one of the second semiconductor layers is coupled to the first semiconductor layer.

10. The method of claim 9 wherein:
the first semiconductor layer and each third semiconductor layer comprise p++ InAlGaAs;
each second semiconductor layer comprises p– GaAsSb;
the emitter comprises InP; and
the collector comprises InP.

11. The method of claim 10 wherein:
the collector has a collector conduction band and a collector valence band; and
the collector valence band is lower than the first valence band of the first semiconductor layer.

12. The method of claim 11 wherein:
the emitter has an emitter conduction band and an emitter valence band; and
the emitter valence band is lower than the third valence band of the third semiconductor layer coupled to the emitter.

13. The method of claim 10 wherein each second semiconductor layer comprises a two dimensional hole gas.

14. A method for forming a heterojunction bipolar transistor (HBT) having an emitter and a collector, the method comprising:

forming a first semiconductor layer coupled to the collector, the first semiconductor layer having a first bandgap between a first conduction band and a first valence band;

forming one or more semiconductor layer groups coupled between the emitter and the first semiconductor layer, each semiconductor layer group comprising:

a second semiconductor layer having a second bandgap between a second conduction band and a second valence band, wherein the second valence band is higher than the first valence band; and a third semiconductor layer coupled to the second semiconductor layer and having a third bandgap between a third conduction band and a third valence band; and forming a conduction band grade between the emitter and the collector;

wherein each of the third valence bands is lower than each of the second valence bands;

wherein one of the third semiconductor layers is coupled to the emitter and one of the second semiconductor layers is coupled to the first semiconductor layer; and wherein the collector has a collector conduction band lower than a conduction band of the conduction band grade at a base-collector junction.

15. The method of claim 14 wherein:
the first semiconductor layer and each third semiconductor layer comprise p++ InAlGaAs;
each second semiconductor layer comprises p– GaAsSb;
the emitter comprises InAlAs; and
the collector comprises InP.

16. The method of claim 14 wherein:
the first semiconductor layer and each third semiconductor layer comprise p++ InAlGaAs having a doping concentration of about $3*10^{19}$ cm$^{-3}$ or any other doping concentration such that the Fermi level of the second semiconductor layer is forced into the second valence band; and each second semiconductor layer comprises p– GaAsSb having a doping concentration of about $1*10^{17}$ cm$^{-3}$ or any other doping concentration that minimizes impurity scattering.

17. The method of claim 14 wherein each second semiconductor layer comprises a two dimensional hole gas.

18. The method of claim 14 wherein:
the collector has a collector conduction band and a collector valence band; and
the collector valence band is lower than the first valence band of the first semiconductor layer.

19. The method of claim 14 wherein:
the emitter has an emitter conduction band and an emitter valence band;
the emitter conduction band is higher than the first conduction band of the first semiconductor layer, each second semiconductor layer and each third semiconductor layer; and
the emitter valence band is lower than the third valence band of the third semiconductor layer coupled to the emitter.

* * * * *